Figure 1:
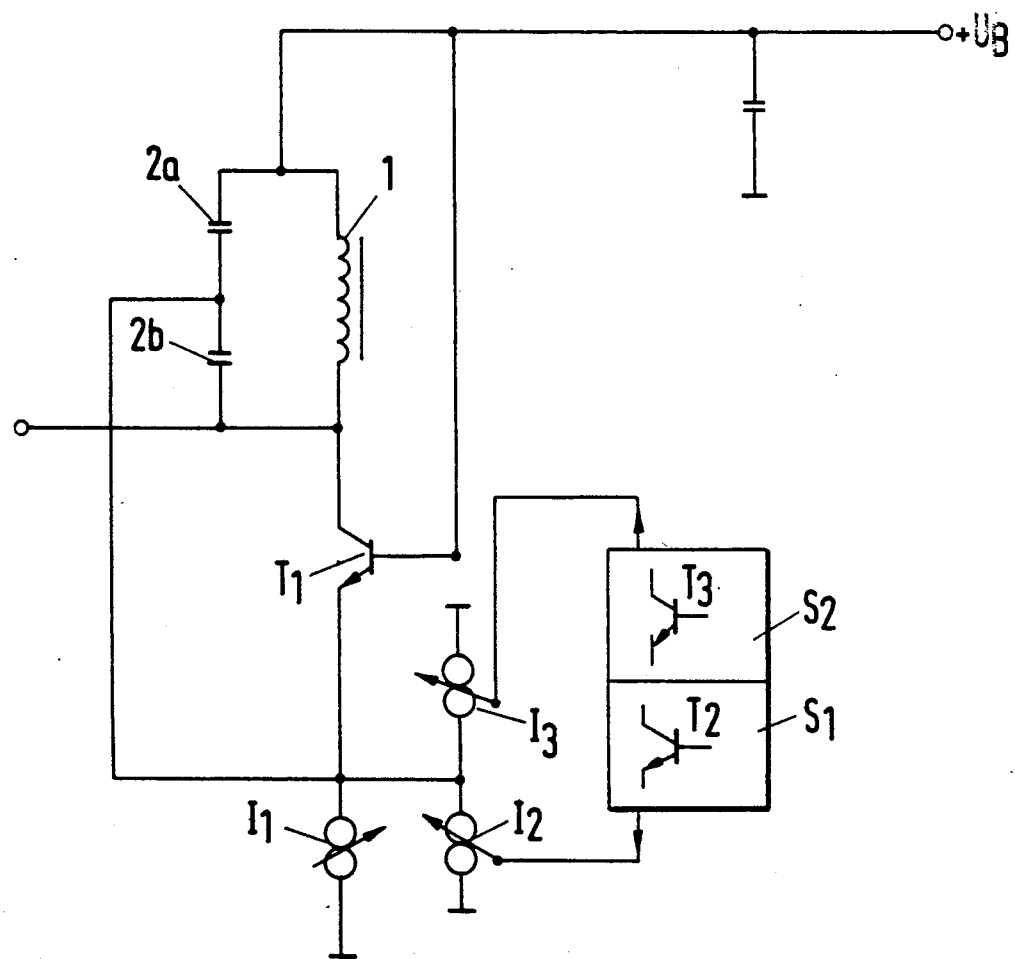

United States Patent [19]

Kriz et al.

[11] Patent Number: 5,043,679

[45] Date of Patent: Aug. 27, 1991

[54] TEMPERATURE-STABLE INDUCTIVE PROXIMITY SWITCH

[75] Inventors: Dieter Kriz, Ludenscheid; Peter Heer, Kirchen, both of Fed. Rep. of Germany

[73] Assignee: Christian Lohse Berührungslose Schalttechnik GmbH, Katzwinkel/Betzdorf, Fed. Rep. of Germany

[21] Appl. No.: 523,002

[22] Filed: May 14, 1990

[30] Foreign Application Priority Data

May 19, 1989 [DE] Fed. Rep. of Germany ....... 3916386
Aug. 7, 1989 [DE] Fed. Rep. of Germany ....... 3926083

[51] Int. Cl.$^5$ .......................... H03B 5/04; H03B 5/12; H03K 17/95; H03L 1/02
[52] U.S. Cl. ........................................ 331/65; 324/327; 324/236; 331/117 R; 331/176
[58] Field of Search ..................... 331/65, 117 R, 176; 324/327, 236

[56] References Cited

U.S. PATENT DOCUMENTS 4,942,372 7/1990 Heimlicher ........................... 331/65
4,949,054 8/1990 Briefer ............................ 331/176 R Primary Examiner—Siegfried H. Grimm
Attorney, Agent, or Firm—Marmorek, Guttman & Rubenstein

[57] ABSTRACT

The invention relates to a temperature-stable inductive proximity switch having a transistorized resonant circuit oscillator. The feeding into the emitter-to-collector circuit of the resonant circuit transistor T1 of a balancing current, which depends on the individually determined temperature of the resonant circuit transistor T1 and the individually determined temperature of the resonant circuit coil, ensures that the proximity switch is temperature-stable with respect to its switching distance for every adjusted basic current.

9 Claims, 4 Drawing Sheets

TEMPERATURE-STABLE INDUCTIVE PROXIMITY SWITCH

The invention relates to an inductive proximity switch having a transistorized resonant circuit oscillator and a current source which is included in the emitter-collector circuit of the resonant circuit transistor and is so controlled by a control device, in dependence on a temperature-sensing device thermally coupled to the resonant circuit oscillator, that the switching distance of the proximity switch is temperature-stable.

An inductive proximity switch requires different resonant circuit coils for different switching distances. To enable the resonant circuit oscillator to oscillate, a sufficiently large basic current must be supplied to the resonant circuit. The oscillation behaviour of transistorized resonant circuit oscillators of course depends on the surrounding temperature. Since inductive proximity switches are required to have high sensitivity, because otherwise the proximity switch will not react accurately enough to slight changes in the distance of the target to be covered, the temperature dependence has a negative effect on the accuracy of the proximity switch.

There are various possible ways of making a resonant circuit oscillator temperature-stable.

For example, attempts have been made to compensate the temperature dependence by means of a temperature-dependent resistor (NTC resistor) disposed in the feedback branch of the resonant circuit transistor. Temperature compensation of that kind has a number of disadvantages:

a) Compensation by means of the temperature-dependent resistor is not optimum, since the temperature-dependent resistance characteristic of the resonant circuit coil is linear, but the resistance characteristic of the temperature-dependent resistor follows an exponential function.

b) The initial tolerances of the temperature-dependent resistors are +/−20% and therefore very high, and its long-term stability is relatively poor.

c) The temperature-dependent resistor is located in the feedback branch through which HF flows and must therefore be disposed immediately adjacent the resonant circuit oscillator. A thermal coupling to the coil, which is the precondition for in excessively long resistor connecting wires for HF.

d) The customary balancing resistor for adjusting the switching distance, which is connected in series to the temperature-dependent resistor, affects the compensation effect of the temperature-dependent resistor.

e) Since HF flows through the balancing resistor, it also must be disposed adjacent the resonant circuit oscillator, so that it cannot be disposed with long connecting wires to the rear end of the resonant circuit oscillator, constructed as a hybrid circuit, although this would be advantageous for a switching distance adjustment by laser calibration.

To obtain better temperature compensation, according to another citation (German Patent Specification 35 27 650 A1) disposed in the emitter-to-collector circuit of the resonant circuit transistor is a current source by means of which, in dependence on the temperature of the oscillator, a balancing current can be fed into the emitter-to-collector circuit, so that the circuit amplification is kept constant via the temperature. The temperature is determined by means of a temperature sensor constructed as a diode. Such a "summary" compensation of the temperature dependence of different structural members of the oscillator is not optimum, since the different structural members have a different temperature course.

It is an object of the invention to provide a proximity switch of the kind specified which reacts independently of temperature on the targets to be covered.

This problem is solved according to the invention in the proximity switch of the kind specified by the features that the temperature-sensing device has: a first temperature sensor in the form of an element which is thermally coupled to the resonant circuit coil and controls the current source upwards as the resistance increases with increasing temperature of the resonant circuit coil, and vice versa; and a second temperature sensor which is thermally coupled to the resonant circuit transistor and, when the resonant circuit transistor is operated in a common base circuit adjusts via the control device the balancing current of the current source, exclusively in dependence on the temperature of the resonant circuit transistor, to maintain the transconductance of the resonant circuit transistor constant and, when the resonant circuit transistor is operated in a common emitter circuit, adjusts via the control device the balancing current of the current source, not only in dependence on the temperature of the resonant circuit transistor, but also in dependence on the adjusted base current of the resonant circuit transistor, to maintain the current amplification factor of the resonant circuit transistor constant.

According to the invention the temperatures of the structural members of the proximity switch responsible for a temperature dependence are determined individually and countermeasures depending on the structural component are taken via the feeding in of a balancing current, so that as a result the proximity switch is independent of temperature. Another advantage of the invention is that no element for temperature compensation is disposed in a branch through which HF flows. For this reason the temperature sensor for the resonant circuit coil can be displaced as far as said coil without disadvantages to compensation even with long connecting wires. The thermal coupling between the temperature sensor and the resonant circuit coil can therefore be very close, and more particularly the temperature sensor can be disposed on the resonant circuit coil. This can be done more particularly with a transistor, which in that case has the same temperature as the resonant circuit coil. Since the transistor has a linear characteristic in narrow tolerances and good long-term stability as regards its data, optimum temperature compensation is ensured for the resonant circuit coil, which also has a linear characteristic. Any differing transconductances of the linear characteristics of the resonant circuit coil and the transistor disposed thereon can be adapted, for example, by a multiplier connected to the current source.

Of the two alternative possibilities of operation in the common base or common emitter configuration, the former is preferred, since this is the simplest manner of compensation, because the control of the fed-in balancing current is based on the linear relationship of the transconductance and temperature of the resonant circuit transistor. In the second case the basic current must be taken into account for the temperature compensation, since it has been found that with changes in the switching distance of the proximity switch different basic currents with different changes in temperature differ because the current amplifying factor of the resonant circuit transistor has not only a non-linear dependence on temperature, but also on the collector current.

According to another feature of the invention, temperature detection can be further improved even if the thermal coupling between a temperature sensor disposed on the resonant circuit coil is already very close. According to this feature the temperature sensor is formed by the ferrite core of the resonant circuit coil, which acts as an ohmic resistor and for whose resistance characteristic, following an exponential function, the control device has a linearization. The control device can be electrically connected via two measuring wires directly to spaced-out connection points of the ferrite core, the connection points being disposed diametrically opposite.

This construction is distinguished from other thermal couplings by the feature that the use of the ferrite core of the resonant circuit coil, which is present in any case, produces a direct thermal coupling between the temperature sensor and the temperature-dependent resonant circuit coil, something which is a precondition for a more precise temperature compensation. In comparison with NTC resistors as temperature sensors, the ferrite core is free from the disadvantages of high initial tolerances and low long-term stability.

The temperature sensor thermally coupled to the resonant circuit transistor should also preferably be a transistor. In that case both transistors can be formed on the same semiconductor crystal for optimum thermal coupling.

Figure 2:
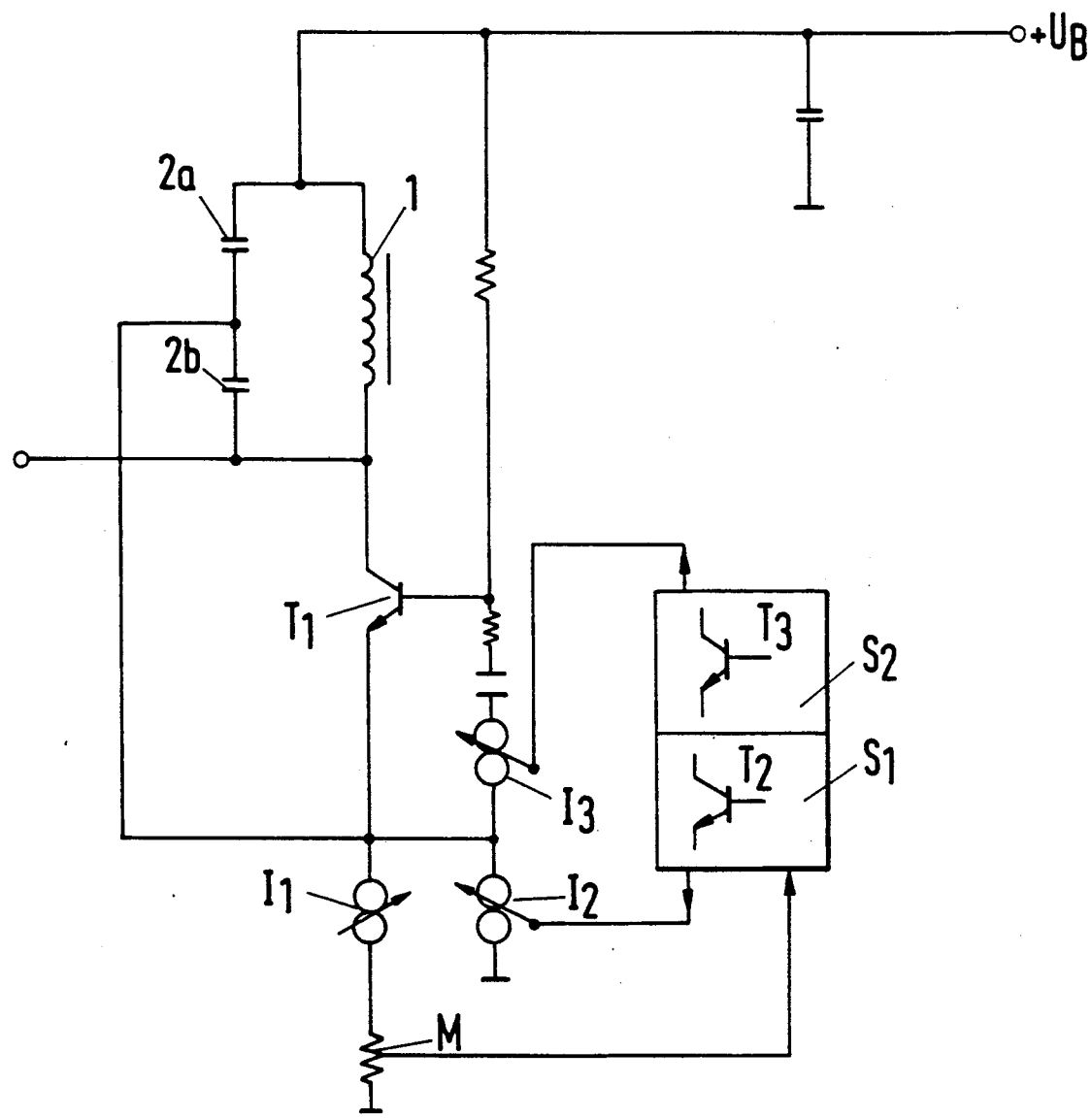
Figure 3:
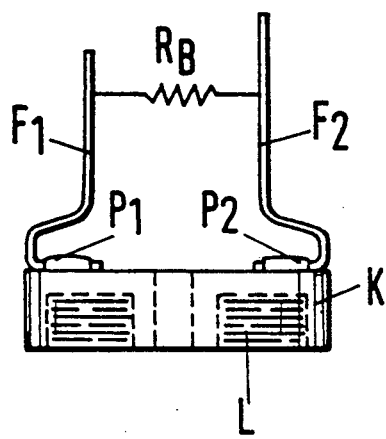
Figure 4:
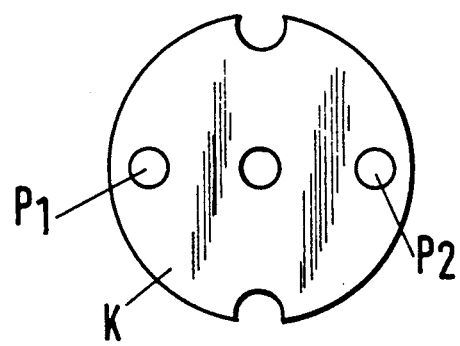
Figure 5:
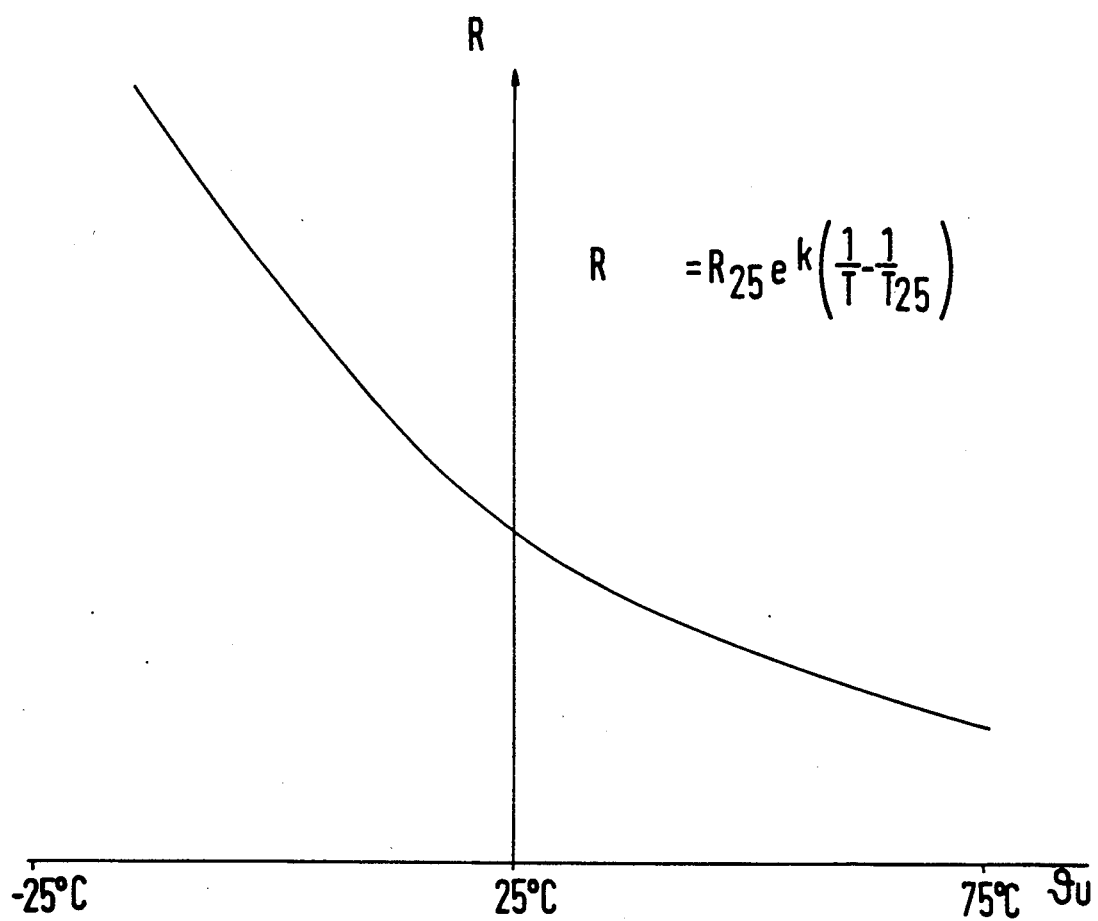

The invention will now be explained in greater detail with reference to circuit diagrams representing various embodiments of inductive proximity switches. In the drawings:

FIG. 1 shows a proximity switch in which the transconductance of the resonant circuit transistor is maintained constant, FIG. 2 shows a proximity switch in which the current amplification factor of the resonant circuit transistor is maintained constant, FIG. 3 is a side view of a resonant circuit coil of the resonant circuit oscillator of the proximity switch shown in FIGS. 1 or 2, FIG. 4 is a plan view of the resonant circuit coil shown in FIG. 3, and FIG. 5 is a temperature-dependent characteristic of the ferrite core of the resonant circuit coil shown in FIGS. 2 and 3.

In the two embodiments a serial circuit comprising a resonant circuit with a resonant circuit coil 1 and resonant circuit capacitors 2a, 2b and a resonant circuit transistor T1 is applied to a d.c. source $U_B$. The resonant circuit transistor T1, operated in a common base circuit, is coupled to the resonant circuit 1, 2a, 2b. The resonant circuit 1, 2a, 2b and the coupled resonant circuit transistor T1 form an oscillator (Colpitts oscillator).

Included in the emitter-to-collector circuit of the resonant circuit transistor T1 is a current source I1 which can be adjusted to a basic current required for the operation of the resonant circuit 1, 2a, 2b, T1. A balancing current is fed into the emitter-to-collector circuit of the resonant circuit transistor T1 from a second adjustable current source I2. The value of the balancing current is determined by a control device S1 including a transistor T2 used as a sensor for the temperature of the resonant circuit transistor T1, which is disposed on the same semiconductor crystal as the resonant circuit transistor T1, for the purpose of temperature coupling.

The control device S1 also comprises a circuit which takes into account the individual data of the transistors T1, T2, more particularly the characteristic field of the transconductance $g_m$ of the resonant circuit transistor T1. For the transconductance we have the known relation:

$$g_m = \frac{I_S}{U_T} e^{U_{BE}/U_T} = \frac{I_C}{U_T}$$

with $$U_T = \frac{K \cdot T}{e_O} = \frac{1.38 \cdot 10^{-23} J/K \cdot T}{1.60 \cdot 10^{-19} C}$$

where
$I_S$ = saturation current of transistor $T_1$
$U_T$ = temperature voltage of transistor $T_1$
e = base of the natural logarithm
$U_{BE}$ = base emitter voltage of transistor $T_1$
$I_c$ = collector current of transistor $T_2$
K = Boltzmann constant
$e_O$ = elementary unit of charge
J = Joule
C = Coulomb
T = absolute temperature in degrees Kelvin If therefore the temperature is determined by the transistor T2, to maintain the transconductance $g_m$ constant, the current of the current source I2 and therefore the collector current $I_C$ can be so controlled in dependence on temperature that the transconductance $g_m$ remains constant.

Included in the collector-to-emitter circuit of the resonant circuit transistor T1 is a third current source I3 which is operated by a control device S2 comprising a temperature sensor in the form of a transistor T3 which can be glued to the core of the resonant circuit coil for the purpose of temperature coupling. In dependence on the temperature of the resonant circuit coil 1 detected by the temperature sensor T3, the control device S2 controls the current source I3 upwards with an increasing temperature of the resonant circuit coil 1 and downwards with a decreasing temperature.

Instead of the temperature sensor constructed as a transistor T3, a temperature sensor can be used an embodiment of which is shown in FIGS. 3 and 4. In this embodiment the resonant circuit coil 1 consists of a winding L and a dished core K. The winding L is cast in the dish and in this way thermally closely coupled to the core K. The core K is made of a ferrite material having a temperature-dependent, non-linear resistance. The temperature behaviour of the resistance is determined by the following function:

$$R_{core} = R_{25} e^{k(\frac{1}{T} - \frac{1}{T_{25}})}$$

where the values $R_{25}$, K, $T_{25}$ denote the following:
$R_{25}$: resistance of the ferrite core at 25° C.
K : ferrite-specific constant
$T_{25}$: 273.15 K + 25 (absolute temperature at 25° C.)
T : 273.15 K + $\nu$(° C.) (absolute surrounding temperature)

Measuring wires $F_1$, $F_2$ of the control device S2 are connected at diametrically opposite places on the core K. A bridging resistor RB is disposed in parallel with the core K forming the ohmic resistance. The control device S2 linearizes the temperature-dependent signal received via the measuring wires $F_1$, $F_2$, so that the control device operates the current source I3 and therefore reacts to compensate temperature-caused linear changes in the damping of the resonant circuit coil 1.

The embodiment illustrated in FIG. 2 differs from that shown in FIG. 1 mainly by the feature that disposed in the emitter-to-collector circuit of the resonant circuit transistor T1 is a measuring member M which supplies to the control device S1 a measured value for the current in the emitter-to-collector circuit. In this case the control device S1 comprises the characteristic field of the current amplification factor $\beta$ of the resonant circuit transistor T1. In dependence on the operating characteristic values - i.e., the current in the emitter-to-collector circuit and the temperature of the transistors T1 and T2, the control device S1 ensures that due to the current amplification factor being maintained constant, the proximity switch has a temperature-stable switching distance for every basic current selected for the resonant circuit coil 1.

In the embodiment illustrated in FIG. 2 the invention is put into effect in an oscillator in a common emitter circuit; however, it is more advantageous to operate an oscillator in a common base circuit (FIG. 1), in which the current source I2 is controlled exclusively in dependence on the temperature of the resonant circuit transistor T1, to maintain its transconductance constant.

As a result, a temperature-independent switching distance is maintained in the proximity switch according to the invention.

We claim:

1. An inductive proximity switch comprising
   a resonant circuit osciallator including a resonant circuit coil, a resonant circuit transistor and a current source in an emitter circuit of said resonant circuit transistor,
   temperature sensing means coupled to said resonant circuit oscillator, and
   control means for controlling said current source in response to said temperature sensing means so that a switching distance of the proximity switch is temperature stable,
   wherein said temperature sensing means comprises a first temperature sensor which is thermally coupled to said resonant circuit coil for controlling said current source to higher current as a resistance of said coil increases with increasing temperature and to lower current as the resistance of said coil decreases with decreasing temperature, and
   a second temperature sensor which is coupled to said resonant circuit transistor for varying the current source exclusively depending on the temperature of said resonant circuit transistor to maintain the transconductance of said resonant circuit transistor constant when said resonant circuit transistor is operated in a common-base configuration, and for varying said current source depending on the temperature of the resonant circuit transistor and on an emitter to collector current of said resonant circuit transistor for maintaining a current amplification factor of the resonant circuit transistor as constant when the resonant circuit transistor is operated in a common emitter configuration.

2. The proximity switch of claim 1 wherein said first temperature sensor coupled to said resonant circuit coil comprises a transistor.

3. The proximity switch of claim 2 wherein said transistor of said first temperature sensor is disposed directly on the resonant circuit coil.

4. The proximity switch of claim 2 wherein said coil includes a core on which said transistor of said first temperature sensor is disposed.

5. The proximity switch of claim 1 wherein said coil of said resonant circuit comprises a ferrite core having a temperature dependent non-linear resistance which follows an exponential function, wherein said core serves as said first temperature sensor by generating a temperature dependent signal in accordance with temperature induced changes in its resistance, and wherein said control means linearizes said temperature dependent signal.

6. The proximity switch of claim 5 wherein said control means is connected via first and second wires to first and second connection points of said core.

7. The proximity switch of claim 6 wherein said first and second connection points are diametrically opposed.

8. The proximity switch of one of claim 1, 2, 3, 4, 5, or 6 wherein said second temperature sensor is a transistor which is thermally coupled to said resonant circuit transistor.

9. The proximity switch of claim 8 wherein said transistor of said second temperature sensor and said resonant circuit transistor are thermally coupled and formed in the same semiconductor crystal.

* * * * *